US006682807B2

(12) United States Patent
Lairson et al.

(10) Patent No.: US 6,682,807 B2
(45) Date of Patent: Jan. 27, 2004

(54) MAGNETIC DISK COMPRISING A FIRST CARBON OVERCOAT HAVING A HIGH SP3 CONTENT AND A SECOND CARBON OVERCOAT HAVING A LOW SP3 CONTENT

(75) Inventors: Bruce Lairson, Los Altos, CA (US); Ching Jackie Tsoi, Milpitas, CA (US); Wen Liu, San Jose, CA (US); Shigeto Hashimoto, Yamagata (JP); Eric Woo Hock Yong, Penang (ML); Tsutomu Tom Yamashita, San Jose, CA (US)

(73) Assignee: Komag, Inc., San Jose, CA (US)

( * ) Notice: Subject to any disclaimer, the term of this patent is extended or adjusted under 35 U.S.C. 154(b) by 0 days.

(21) Appl. No.: 10/255,295

(22) Filed: Sep. 26, 2002

(65) Prior Publication Data

US 2003/0027019 A1 Feb. 6, 2003

Related U.S. Application Data

(62) Division of application No. 09/604,490, filed on Jun. 27, 2000, now Pat. No. 6,565,719.

(51) Int. Cl.[7] .................................................. G11B 5/72

(52) U.S. Cl. ...................... 428/212; 428/216; 428/65.5; 428/408; 428/694 TC

(58) Field of Search ............................. 428/212, 216, 428/65.5, 408, 694 TC

(56) References Cited

U.S. PATENT DOCUMENTS

| RE32,464 E | 7/1987 | Aine ........................ 428/622 |
| 5,110,676 A | 5/1992 | Murai et al. ................ 428/336 |
| 5,232,570 A | 8/1993 | Haines et al. .......... 204/192.16 |
| 5,268,216 A | 12/1993 | Keem et al. ................ 428/216 |
| 5,476,691 A | 12/1995 | Komvopoulos et al. .... 427/527 |

(List continued on next page.)

FOREIGN PATENT DOCUMENTS

| EP | 0 547 820 | 6/1993 |
| JP | 62-183022 | 8/1987 |
| JP | 1-320622 | 12/1989 |
| JP | 5-143972 | 6/1993 |
| JP | 8-212533 | 8/1996 |
| JP | 9-44844 | 2/1997 |
| JP | 9-288818 | 11/1997 |
| JP | 10-50235 | 2/1998 |
| JP | 10-172130 | 6/1998 |
| JP | 10-299012 | 8/1998 |
| JP | 11-39647 | 2/1999 |
| WO | WO 99/03099 | 1/1999 |

OTHER PUBLICATIONS

Ian G. Brown, "Vacuum Arc Ion Sources", Rev. Sci. Instrum. 65(10), Oct. 1994, pp. 3061–3081.

Anders, et al., "Mechanical Properties of Amorphous Hard Carbon Films Prepared by Cathodic Arc Deposition", Mat. Res. Soc. Symp. Proc. vol. 383, 1995, pp. 453–458.

Sanders, et al., "Coating Technology Based on the Vacuum Arc—A Review", IEEE Transactions on Plasma Science, vol. 18, No. 6, Dec. 1990, pp. 883–894.

J. Robertson, "Ultrathin Carbon Overcoats for Magnetic Storage Technology", TRIB–vol. 9, Proceedings of the Symposium on Interface Technology Towards 100 Gbit/in$^2$, ASME 1999, pp. 39–45.

(List continued on next page.)

*Primary Examiner*—Stevan A. Resan

(57) ABSTRACT

A method for making a magnetic disk comprises forming first and second protective carbon layers on a magnetic layer. The first protective carbon layer is predominantly SP3 carbon. The second protective carbon layer comprises about 50% or less SP3 carbon. The second protective carbon layer is very thin, e.g. between 0.1 and 1.0 nm thick. A lubricant layer (e.g. a perfluoropolyether lubricant) is applied to the second protective carbon layer. The second protective carbon layer facilitates improved cooperation between lubricant and the disk.

21 Claims, 2 Drawing Sheets

U.S. PATENT DOCUMENTS

| | | | |
|---|---|---|---|
| 5,507,930 A | 4/1996 | Yamashita et al. | 204/192.15 |
| 5,540,957 A | 7/1996 | Ueda et al. | 427/535 |
| 5,587,217 A | 12/1996 | Chao et al. | 428/65.4 |
| 5,637,393 A | 6/1997 | Ueda et al. | 428/332 |
| 5,714,044 A | 2/1998 | Lal et al. | 204/192.16 |
| 5,805,380 A | 9/1998 | Ishihara et al. | 360/103 |
| 5,837,357 A | 11/1998 | Matsuo et al. | 428/212 |
| 5,855,746 A | 1/1999 | Prabhakara et al. | 204/192.16 |
| 5,858,182 A | 1/1999 | Horng et al. | 204/192.16 |
| 5,858,477 A * | 1/1999 | Veerasamy et al. | 427/562 |
| 6,086,730 A | 7/2000 | Liu et al. | 204/192.16 |
| 6,165,582 A | 12/2000 | Hayashi | 428/65.3 |
| 6,197,120 B1 | 3/2001 | David | 118/710 |
| 6,238,780 B1 * | 5/2001 | Wu et al. | 428/213 |
| 6,303,214 B1 * | 10/2001 | Chour et al. | 428/212 |

OTHER PUBLICATIONS

Report submitted in IDS mailed to USPTO on Jan. 31, 2002.

Weiler et al., "Deposition of Tetrahedral Hydrogenated Amorphous Carbon Using a Novel Electron Cyclotron Wave Resonance Reactor", Applied Physics Letters, vol. 72, No. 11, Mar. 16, 1998, pp. 1314–1316.

Dae–Hwan Kang et al., "Evaluation of the Ion Bombardment Energy for Growing Diamondlike Carbon Films in an Electron Cyclotron Resonance Plasma Enhanced Chemical Vapor Deposition", J. Vac. Sci. Technol. A 16(4) Jul./Aug. 1998, pp. 2625–2631.

* cited by examiner

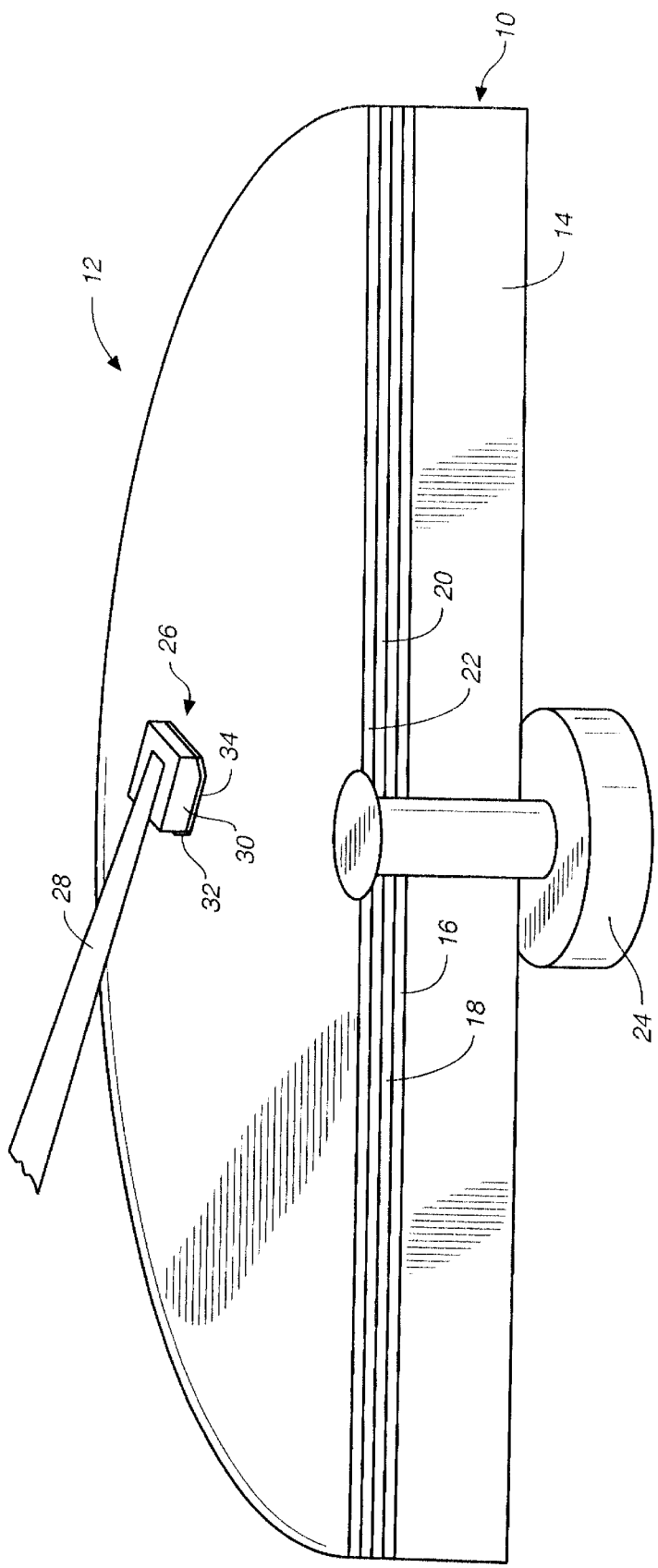
FIG._1
(PRIOR ART)

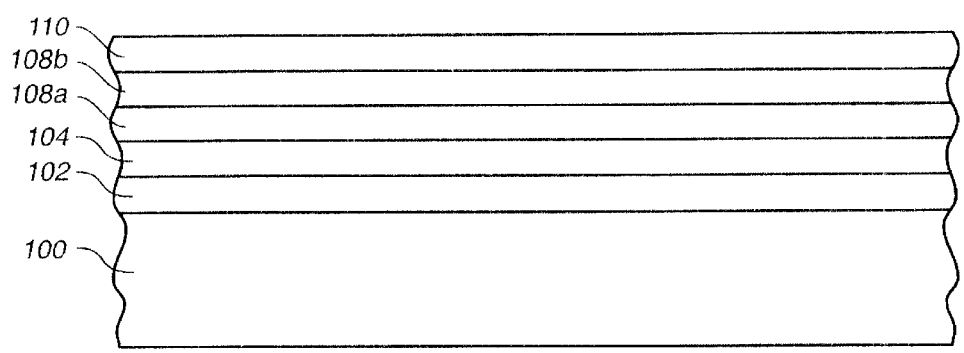
FIG._2

MAGNETIC DISK COMPRISING A FIRST CARBON OVERCOAT HAVING A HIGH SP3 CONTENT AND A SECOND CARBON OVERCOAT HAVING A LOW SP3 CONTENT

This patent is a divisional of U.S. patent application Ser. No. 09/604,490, filed Jun. 27, 2000 now U.S. Pat No. 6,565,719.

BACKGROUND OF THE INVENTION

This invention pertains to methods for manufacturing magnetic disks comprising carbon protective overcoats and the resulting magnetic disks.

FIG. 1 illustrates in cross section a magnetic disk 10 in a disk drive 12. Magnetic disk 10 comprises a substrate 14 (e.g. glass, glass ceramic, or NiP-plated aluminum), an underlayer 16 (e.g. Cr, a Cr alloy, NiP, NiAl or other appropriate material), a magnetic layer 18 (e.g. a Co alloy), and a protective overcoat 20 (e.g. hydrogen-doped carbon, nitrogen-doped carbon, or carbon doped with both hydrogen and nitrogen). A lubricant layer 22 (e.g. perfluoropolyether) is applied to protective overcoat 20.

Magnetic disk 10 is mounted on a spindle that is rotated by a motor 24. A read-write head 26, mounted on a suspension 28, "flies" above the rotating disk. Head 26 comprises a slider including a hard $Al_2O_3$—TiC body 30 with a read-write element 32 formed on the trailing edge thereof. A carbon overcoat 34 is formed on the bottom surface (the air bearing surface) of head 26 for tribological purposes.

Magnetic layer 18 performs the function of storing data. Overcoat 20 performs several functions:

a) It prevents corrosion of magnetic layer 18.

b) It is hard, and prevents mechanical damage of magnetic layer 18.

c) It exhibits low static and dynamic friction.

d) It holds lubricant layer 22 on disk 10.

e) It prevents wear of disk 10.

Industry has devoted a large amount of time and effort trying to form appropriate carbon films to be deposited on magnetic disks as protective layers. For example, F. K. King, "Datapoint Thin Film Media", IEEE Trans. Magn., July 1982, discusses sputtering carbon on a magnetic disk. U.S. Pat. No. 5,045,165, issued to Yamashita, discusses sputtering a hydrogen-doped carbon film on a magnetic disk to prevent wear and corrosion. Yamashita teaches that the hydrogen enhances wear resistance of the carbon. European Patent Application EP 0 547 820 discusses sputtering a nitrogen-doped carbon film on a magnetic disk. The '820 application states that the nitrogen reduces stress in the carbon, and reduces the likelihood that the carbon will delaminate from the disk. U.S. Pat. No. 5,837,357 discusses a magnetic disk comprising a hydrogen-doped carbon film covered by a nitrogen-doped carbon film. U.S. Pat. No. 5,232,570 also discusses sputtering carbon on the magnetic disk in the presence of nitrogen. Other references pertaining to carbon overcoats for magnetic disks include U.S. Pat. No. 5,855,746 and PCT Patent Application WO 99/03099. This list is by no means exhaustive.

Protective carbon overcoats for magnetic disks are typically formed by sputtering. Because of the way in which they are formed, they comprise mostly SP2 carbon. Industry has been using such carbon films for many years, and has considerable experience with these films. Thus, various types of lubricants have been developed which can be applied to predominantly SP2 carbon films to cause these films to exhibit low friction and stiction. (As used herein, the term "predominantly SP2 carbon" means that of the carbon bonds in the film, more of those bonds are SP2 than any other type of bond. Similarly, "predominantly SP3 carbon" means that of the carbon bonds in the film, more are SP3 than any other type of bond.)

Recently, Komag (the assignee of the present invention) developed a new type of carbon overcoat comprising more than 70% SP3 carbon. This type of carbon overcoat is described by Wen Hong Liu et al. in U.S. patent application Ser. No. 09/298,107, filed on Apr. 22, 1999, incorporated herein by reference. The '107 carbon is deposited by applying a novel voltage waveform to carbon sputtering targets. It has been discovered that this carbon overcoat is extremely hard and scratch resistant.

There are other types of carbon overcoats that have high SP3 contents. In particular, one can form a carbon film using chemical vapor deposition, ion beam deposition, or cathodic arc deposition. Weiler et al., "Deposition of Tetrahedral Hydrogenated Amorphous Carbon Using a Novel Electron Cyclotron Wave Resonance Reactor", Applied Physics Letters, Vol. 72, No. 11, Mar. 16, 1998, discusses ion beam deposition of carbon. Kang, et al., "Evaluation of the Ion Bombardment Energy for Growing Diamondlike Carbon in an Electron Cyclotron Resonance Plasma Enhanced Chemical Vapor Deposition", J. Vac. Sci. Technol. A. 16(4), July/August 1998, discusses using chemical vapor deposition to form a carbon film. J. Robertson, "Ultrathin Carbon Overcoats for Magnetic Storage Technology", TRIB-Vol. 9, Proceedings of the Symposium on Interface Technology Towards 100 $Gbit/in^2$, ASME 1999 discusses cathodic arc deposition. Other references include U.S. Pat. No. 5,476, 691; Brown, "Vacuum Arc Ion Sources", Rev. Sci. Instrum. 65(10), October 1994, Sanders, et al., "Coating Technology Based on the Vacuum Arc—a Review", IEEE Transactions on Plasma Science, Vol. 18, No. 6, 1990; and Anders et at., Mechanical Properties of Amorphous Hard Carbon Films Prepared by Cathodic Arc Deposition", Mat. Res. Soc. Symp. Proc. Vol. 383, 1995. Japanese laid-open publication 62-183022 discusses using a plasma CVD process to make a carbon film on a magnetic disk. Weiler, Kang, Robertson, the '691 patent, Brown, Sanders, Anders, and the 62-183022 references are incorporated herein by reference.

SP3 carbon has an atomic structure that differs from SP2 carbon. Accordingly, the behavior of SP2 carbon can be quite different from SP3 carbon—sometimes to an unpredictably great extent.

As mentioned above, magnetic disk drive 12 contains magnetic disk 10 with carbon protective overcoat 22 and lubricant 24 applied to the disk. The disk substrate 14 is textured to minimize friction and stiction between disk 12 and read-write head 26. The disk/read-write head interface constitutes a finely tuned tribological system designed to minimize static and dynamic friction and wear. The texturing of the disk, the composition, deposition conditions and structure of carbon protective overcoats 22 and 34, the other elements added to the carbon overcoats, the types of lubricants, the additives in the lubricants, lubricant application process and related parameters are determined based on exhaustive research to ensure that the disk drive can survive a large number of on/off (contact-start-stop, or "CSS") cycles. Changing one element in this tribological system can alter the behavior of the entire system. For example, if one were to replace a conventional type of predominantly SP2 carbon with a different type of carbon, e.g. a predominantly SP3 carbon, that can completely change the behavior of the tribological system.

Merely by way of example, it has been discovered that when one tries to use the '107 type carbon and a perfluoropolyether lubricant such as Z-dol (manufactured by Montedison Co. of Italy) mixed with an X1P additive, for reasons not well understood, the resulting disks tend to fail glide tests. This is particularly interesting and unexpected, since the lubricant thickness is only about 3 nm, whereas the glide testing is performed at a glide height of about 1 microinch, or about 25 nm. Thus, it is highly unexpected that the lubricant could interact with the carbon film in such a way as to cause a failure in a glide test where the glide height is eight times the lubricant thickness.

Certain forms of high SP3 carbon formed by chemical vapor deposition have been found to exhibit other problems, i.e. sensitivity to certain types of contaminants.

SUMMARY

A method in accordance with the invention comprises depositing first and second carbon layers on a magnetic disk and then applying a lubricant to the magnetic disk. In one embodiment, the first carbon layer is predominantly SP3 carbon. The first layer can have 70% or greater SP3 bonding. The second layer comprises less than or equal to 50% SP3 bonding. The second layer can be extremely thin, e.g. a flash layer of having a thickness between 0.1 and 1 nm. The lubricant can be a perfluoropolyether lubricant.

Of importance, the high SP3 content protective layer is extremely hard, and resists wear and scratching. Because the second protective layer is so thin, it does not add substantially to the separation of the magnetic film within the disk and the read-write head.

It has further been discovered that although the second protective layer is extremely thin, the properties of the second protective layer control the manner in which the lubricant cooperates with the disk. In particular, although the second carbon layer is only 0.1 to 1 nm thick, the lubricant bonds with, and adheres to the second carbon layer in the same way that the lubricant would cooperate with the carbon on a conventional magnetic disk. The second carbon layer can mask any deleterious effects that the high SP3 content of the first carbon layer would otherwise have on the disk's interaction with the lubricant.

As mentioned above, the first and second carbon layers have different structures. Because the first carbon layer has mostly SP3 bonds, it has a density greater than about 2.1 grams/cc, and typically about 2.5 grams/cc. In contrast, the second carbon layer has a lower density, e.g. less than about 2.1 grams/cc, and typically 1.8 grams/cc.

The first carbon layer has a refractive index that is greater than 2.0, and typically about 2.1. The second carbon layer has a lower refractive index than the first carbon layer, less than about 2.0 and typically about 1.8.

In one embodiment, the first carbon layer has a lower surface energy than the second carbon layer. (One way of measuring the surface energy is by a water contact energy test. The difference in water contact angle between the first and second carbon layers can be greater than 3 degrees and in one embodiment, greater than about 5 degrees. This difference in water contact angle is typically less than about 8 degrees.)

In accordance with another aspect of the invention, a new type of carbon overcoat is introduced into the manufacturing process for a magnetic disk without requiring the exhaustive optimization and reengineering that normally occurs when one makes a change to one of the elements of the tribological system of the disk and read-write head. In accordance with this aspect of the invention, a process for manufacturing a magnetic disk initially comprises the steps of:

a) providing a structure comprising a substrate with a magnetic layer thereon;

b) depositing a first carbon overcoat on the magnetic layer (e.g. a predominantly SP2 carbon overcoat formed by sputtering); and c) applying a lubricant layer on the protective overcoat.

A method in accordance with the invention comprises replacing the step of depositing the first carbon overcoat with the step of providing a carbon overcoat having characteristics that are different from those of the first overcoat (e.g. an overcoat with predominantly SP3 carbon), followed by the step of a depositing a very thin layer of carbon using the same or substantially the same deposition conditions as those used to form the first carbon overcoat. For example, the process gas composition, pressure, and flow rate are the same or substantially the same. The substrate bias and temperature can be the same or substantially the same. Thus, the top surface of the magnetic disk, comprising the very thin layer of carbon, cooperates with the lubricant in substantially the same way as the above-mentioned first layer of carbon. Therefore, it is not necessary to do the substantial testing and engineering work that would otherwise need to be done if one simply replaced the first carbon overcoat with a predominantly SP3 carbon overcoat.

The predominantly SP3 carbon overcoat can be formed using the method of the '107 patent, or it can be deposited by CVD or cathodic arc deposition.

BRIEF DESCRIPTION OF THE DRAWINGS

FIG. 1 illustrates in cross section a magnetic disk drive constructed in accordance with the prior art.

FIG. 2 illustrates in cross section a magnetic disk constructed in accordance with the present invention.

DETAILED DESCRIPTION

A process in accordance with the present invention comprises the following steps. First, a substrate 100 (FIG. 2) is provided. The substrate can be glass, glass ceramic, NiP-plated aluminum or other substrate material. Substrate 100 is then textured, e.g. using mechanical, laser or chemical techniques. (Such techniques are well known in the art.) One or more underlayers 102 (e.g. Cr, a Cr alloy, NiP, NiAl or other material) is deposited, e.g. by sputtering, onto substrate 100. Underlayer 102 can be about 10 to 30 nm thick.

One or more magnetic alloy layers 104 (e.g. a Co or Fe alloy) is deposited, e.g. by sputtering, onto underlayer 102. Magnetic layer 104 can be about 15 nm thick. In one embodiment, underlayer 102 and magnetic alloy layer 104 are formed using the method and materials described in U.S. patent application Ser. No. 08/874,753, filed by Bertero et al. on Dec. 4, 1997 and incorporated herein by reference.

A first overcoat 108a having a relatively high SP3 content is deposited on magnetic alloy layer 104. Overcoat 108a is hard, and has, for example, about 70% or more SP3 carbon, and typically about 80% or more SP3 carbon, e.g. as measured by the reflection energy loss spectrometer (REELS) technique. (The REELS technique is described by Hsiao-chu Tsai et al. in "Structure and Properties of Sputtered Carbon Overcoats on Rigid Magnetic Media Disks", J. Vac. Sci. Technol. A6(4), July/August 1988, incorporated herein by reference.) Overcoat 108a minimizes wear, mechanical damage and corrosion of the disk. Overcoat 108a is typically about 2 to 5 nm thick. In one embodiment, overcoat 108a is formed using the sputtering method described in U.S. Pat. Ser. No. 09/298,107, filed by Wen Hong Lieu et al. on Apr. 22, 1999. In another embodiment, layer 108a can be formed by chemical vapor deposition (CVD) or plasma-enhanced chemical vapor deposition (PECVD). During PECVD, a hydrocarbon gas such as ethylene or acetylene is introduced into the deposition chamber and caused to decompose, e.g. by the application of electrical energy to the chamber. This results in the deposition of a hydrogen-doped carbon film on the magnetic disk.

Overcoat 108a can be formed by other techniques; e.g. cathodic arc deposition or ion beam deposition (IBD), e.g. as described in the above-incorporated references.

A second overcoat 108b is formed on and continuously covers first overcoat 108a, e.g. by sputtering. Second overcoat 108b is an extremely thin "flash" layer, e.g. 0.1 to 1.0 nm thick. (As mentioned above, this flash layer 108b cooperates with a subsequently deposited lubricant layer. As used herein, the term "flash" layer means a layer of sufficient thickness to adequately cooperate with the lubricant layer so that the lubricant functions properly, but not substantially thicker than that.) Overcoat 108b has a much lower SP3 content than overcoat 108a, e.g. less than or equal to about 50%. In one embodiment, the SP3 content is between 40 and 50%. Because of the difference in the structures of overcoats 108a and 108b, they have different characteristics. In one embodiment, carbon 108a has a density of about 2.5 grams/cc, as measured by XRR (x-ray reflectivity). Carbon 108b has a density of 1.8 grams/cc. Carbon 108a has a refractive index, as measured by an ellipsometer, of 2.1, whereas carbon 108b has a refractive index of 1.9.

In one embodiment, carbon 108b is formed by sputtering using a process gas comprising an inert gas such as argon mixed with nitrogen. (Optionally, hydrogen can be included in the process gas.) The gas pressure is between 2 and 10 mTorr, typically between 4 and 9 mTorr, and preferably between 6 to 9 mTorr. The argon flow rate is 50 to 90 SCCM, and the nitrogen flow rate is 4 to 10 SCCM. In some embodiments, bias is applied to the substrate, but in other embodiments, bias is not applied to the substrate. The power density is 1 to 2 W/nm$^2$. The deposition rate of carbon layer 108b is typically substantially less than the deposition rate for carbon layer 108a. In particular, the deposition rate for carbon layer 108a is typically between 0.1 and 2 nm/second, and preferably between 0.5 and 1 nm/second.

After carbon layer 108b is formed, a lubricant layer 110 is applied to the disk. The lubricant can be a perfluoropolyether lubricant. An example of such a lubricant is Fomblin Z-dol, sold by Montedison Co. of Italy. An additive can be added to this lubricant. An example of such an additive is polyphenoxycyclotriphosphazene, described in U.S. Pat. No. 5,587,217, issued to Chao et al., incorporated herein by reference. An additive sold under the trade name X1P, manufactured by Dow Chemical Corp. of Midland, Mich. can be used. The lubricant can be applied to the disk by dipping the disk in a room temperature bath comprising a mixture of the Fomblin Z-dol and X1P. The speed at which the disk is dipped into the lubricant bath can be 1 to 2 mm/minute. Optionally, after the dipping process, the lubricant can be subjected to a baking process. The thickness of the lubricant and additive on the disk is about 3.2 nm, out of which about 3 nm is Z-dol, and 0.2 nm is X1P as measured by the FTIR technique.

Formation Of Carbon Layer 108a by Sputtering

As mentioned above, carbon layer 108a can be formed using the technique described in the '107 application. During one embodiment of this method, a graphite sputtering target us used. The process gas comprises argon, hydrogen and nitrogen. The argon gas flow is 50 to 70 SCCM, the nitrogen gas flow is 0.5 to 2.0 SCCM and the hydrogen gas flow is 15 to 30 SCCM. The power density is about 1 KW/100 cm$^2$, i.e. about 10 W/cm$^2$. Bias supply to the substrate is minus 100 to minus 200 volts. Magnetron sputtering can be employed. Optionally, the substrate can be heated. In one embodiment, sputtering apparatus such as an Anelva C-3010 sputtering apparatus can be used. Other apparatus, such as an Ulvac sputtering machine can also be used. A power supply, e.g. an RPG model pulse power supply made by ENI Inc. of Rochester, N.Y. can be used.

As described in the '107 Application, a unique voltage waveform is applied to the sputtering target. This waveform comprises an initial positive potential portion, e.g. a portion that can be about 300 volts. Thereafter, a negative voltage is applied to the target. The negative portion of the waveform typically comprises a negative pulse followed by a steady state negative voltage. The negative pulse can have two or three times the magnitude of the steady state negative voltage. It is believed that the large negative swing in the voltage applied to the target momentarily causes a high deposition rate and carbon atoms can have much higher energy than they would have during conventional sputtering. It is believed that this voltage waveform causes the new protective overcoat to have a greater SP3 content, and exhibit greater hardness, than typical sputtered carbon films. The waveform applied to the sputtering target can have a frequency between about 50 kHz and 250 kHz.

Formation of Carbon Layer 108a by CVD

In one embodiment, carbon layer 108a is formed by CVD (typically plasma-enhanced CVD, or PECVD) by applying 1000 Watts to the CVD apparatus, with a substrate bias of 300V and a process gas of $C_2H_4$ (ethylene) flowing at a rate of 150 SCCM. The pressure in the deposition chamber is typically between about 20 to 40 mTorr. The process time is about 5 seconds, and results in 5 nm of predominantly SP3 carbon. The substrate is not heated in this particular example of a CVD process. The details for this process are merely exemplary. Other carbon-containing process gases and other parameters can also be used.

Modification of a Pre-existing Manufacturing Process

As mentioned above, a read-write head and magnetic disk form a carefully engineered tribological system designed to minimize friction and stiction between the read-write head and the disk, minimize wear, and maximize the number of contact-start-stop (CSS) cycles that the disk drive can survive. A great amount of engineering effort is required to accomplish these goals. This engineering effort includes:

a) Providing an appropriate disk texture having texture features of an appropriate size, shape and areal density.

b) Providing an appropriate protective overcoat composition (both on the disk and the read-write head). This involves developing an appropriate composition, thickness and morphology and selecting a deposition process for the overcoat (e.g. CVD, sputtering, cathodic arc deposition or IBD). This also requires determining an appropriate process gas composition, a flow rate for each component of the process gas, process gas pressure, substrate bias and substrate temperature.

c) Providing a lubricant composition, thickness and application technique. This also involves selecting additives for the lubricant (including selecting the concentration of the additives), and developing appropriate lubricant application parameters. (For example, for a dipping process, this includes selecting the rate at which the disk is dipped into and withdrawn from the lubricant bath and the bath temperature.)

Replacing one type of protective overcoat on the disk with another protective overcoat can have a deleterious effect on the rest of the tribological system. For example, providing a new carbon overcoat on the disk may cause the disk to fail to cooperate properly with the lubricant.

In accordance with one embodiment of the invention, a method is provided for altering a magnetic disk manufacturing process. The process initially comprises one or more of the steps of:

a) providing a substrate (e.g. a glass substrate, a glass ceramic substrate, a NiP-coated aluminum substrate, or other appropriate substrate material);

b) providing an underlayer on the substrate (e.g. Cr, a Cr alloy, NiP, NiAl, or other appropriate underlayer deposited by sputtering);

c) providing a magnetic layer on the underlayer (e.g. a sputtered Co or Fe alloy);

d) providing an initial protective overcoat on the substrate (e.g. a carbon film sputtered in the presence of nitrogen and/or hydrogen);

e) applying a lubricant to the protective overcoat (e.g. a perfluoropolyether lubricant applied by dipping.

Merely by way of example, the process described in the above-incorporated '753 Bertero application can be used to form the underlayer and magnetic layer. The protective overcoat can be formed by sputtering using the same sputtering conditions as those described for carbon layer 108b above. (In such an embodiment, the power applied to the deposition chamber is typically greater than the above-mentioned 1 to 2 W/cm$^2$ in order to obtain an appropriately high deposition rate.) The lubricant can be the above-mentioned Z-dol-X1P mixture applied by dipping, having a total thickness of about 32 nm.

In accordance with this method, the step of depositing the protective overcoat is replaced with the step of:

a) depositing a first, predominantly SP3 carbon overcoat on the magnetic layer; and b) depositing a second carbon overcoat on the first carbon overcoat.

The first, predominantly SP3 carbon overcoat can be deposited using the deposition techniques and conditions described above for carbon layer 108b. The first carbon overcoat can be about 2 to 5 nm thick. The second carbon overcoat can be deposited by sputtering using the same or substantially the same conditions (e.g. the same or substantially the same process gas composition, flow rates for the various components of the process gas and process gas pressure) as for the initial protective overcoat that is being replaced. The substrate bias and/or substrate temperature can also be the same or substantially the same during deposition. (Typically, the power applied to the sputtering apparatus during deposition of the second carbon overcoat is less than the power used to deposit the initial protective overcoat. This facilitates a slower deposition rate for the second carbon overcoat.) Of importance, the second carbon overcoat has the same or substantially the same composition (including the same or substantially the same hydrogen and/or nitrogen content) and/or morphology (e.g. SP2 and SP3 content) as the initial protective overcoat. Further, the second carbon overcoat cooperates with the lubricant layer in the same or substantially the same way as the initial protective overcoat. Thus, even though the initial protective overcoat is being replaced with a dual layer structure comprising mostly SP3 carbon having a structure that differs from the initial protective overcoat, the second carbon overcoat masks this mostly SP3 carbon, and provides a continuous carbon surface that behaves and cooperates with the lubricant and/or other components of the system (e.g. texture, slider surface, etc.) in the same way as the initial protective overcoat. Thus, one can replace the initial protective overcoat with this new, mostly SP3 carbon, without having to engage in substantial reengineering of the head-disk tribological system.

INDUSTRIAL APPLICATION

A disk constructed using a method in accordance with the present invention is typically incorporated into a disk drive. The disk is coupled to a motor via a spindle. The motor rotates the disk rapidly, while a read-write head "flies" above the disk drive. The read-write head is held in place by a suspension.

While the invention has been described with respect to specific embodiments, those skilled in the art will recognize that changes can be made in form and detail without departing from the spirit and scope of the invention. For example, the process gas used to form layer 108b can include between 0 and 20% nitrogen, 0 and 20% hydrogen in addition to an inert gas. In some embodiments, the SP3 content of layer 108b is between 30 and 60%, but still substantially less than the SP3 content of layer 108a. The various layers (102 to 110) can be formed on one or both sides of substrate 100. Accordingly, all such changes come within the present invention.

We claim:

1. A magnetic disk comprising:
   a substrate;
   a magnetic layer formed on said substrate;
   a first carbon layer formed on said magnetic layer, said first carbon layer comprising predominantly SP3 carbon;
   a second carbon layer formed on said first carbon layer, said second carbon layer comprising about 60% or less SP3 carbon, the SP3 content of said second carbon layer being less than the SP3 content of the first carbon layer; and
   a lubricant layer on said second carbon layer.

2. Disk of claim 1 wherein the second carbon layer comprises less than 50% SP3 carbon.

3. Disk of claim 1 wherein said wherein said second carbon layer is a flash carbon layer.

4. Disk of claim 1 wherein said second carbon layer is between 0.1 and 1.0 nm thick.

5. Disk of claim 1 wherein said first carbon layer is less than 5 nm thick and said second carbon layer is less than 1 nm thick.

6. Disk of claim 1 wherein said first carbon layer comprises 70% or greater SP3 bonding.

7. Disk of claim 1 wherein said first carbon layer comprises about 80% or greater SP3 bonding.

8. Disk of claim 1 wherein said first carbon layer has a density greater than about 2.1 grams/cc.

9. Disk of claim 1 wherein said first carbon layer has a refractive index greater than 2.0.

10. A disk drive comprising the disk of claim 1.

11. Magnetic disk of claim 1 wherein said first carbon layer is substantially thicker than said second carbon layer.

12. Magnetic disk of claim 1 wherein the first carbon layer has a lower surface energy than the second carbon layer.

13. A magnetic disk comprising:
   a substrate;
   a magnetic layer formed on said substrate;
   a first carbon layer formed on said magnetic layer, said first carbon layer being formed by sputtering during which a voltage is applied to a sputtering target, said sputtering target comprising carbon, said voltage being applied by a power supply in the form of pulses, said pulses comprising at least a first portion and a second portion, the voltage applied during the second portion being more negative than that applied during the first portion, wherein a first sub-portion of the second portion is more negative than a second sub-portion of said second portion;
   a second carbon layer formed on said first carbon layer, said second carbon layer comprising about 60% or less SP3 carbon, the SP3 content of said second carbon layer being less than the SP3 content of the first carbon layer; and
   a lubricant layer on said second carbon layer.

14. A disk drive comprising the disk of claim 13.

15. Disk of claim 13 wherein said first carbon layer is less than 5 nm thick and said second carbon layer is less than 1 nm thick.

16. Disk of claim 13 wherein said first carbon layer comprises about 70% or greater SP3 bonding.

17. Disk of claim 13 wherein said first carbon layer comprises 80% or greater SP3 bonding.

18. Disk of claim 13 wherein said first carbon layer has a density greater than about 2.1 grams/cc.

19. Disk of claim 13 wherein said first carbon layer has a refractive index greater than 2.0.

20. Magnetic disk of claim 13 wherein said first carbon layer is substantially thicker than said second carbon layer.

21. Magnetic disk of claim 13 wherein the first carbon layer has a lower surface energy than the second carbon layer.

* * * * *